US005657075A

United States Patent [19]
Roessner

[11] Patent Number: 5,657,075
[45] Date of Patent: Aug. 12, 1997

[54] METHOD AND APPARATUS FOR LOCATING AND FACILITATING THE REPAIR OF DEFECTS ON A PRINTED CIRCUIT BOARD

[75] Inventor: George A. Roessner, Langhorne, Pa.

[73] Assignee: Teradyne, Inc., Boston, Mass.

[21] Appl. No.: 14,120

[22] Filed: Feb. 5, 1993

[51] Int. Cl.⁶ ........................................... H04N 7/18
[52] U.S. Cl. ......................... 348/126; 348/87; 348/92
[58] Field of Search ........................... 348/86, 87, 90, 348/91, 92, 95, 126; 156/627; 364/552; 382/8; H04N 7/18

[56] References Cited

U.S. PATENT DOCUMENTS

| | | | |
|---|---|---|---|
| 4,469,553 | 9/1984 | Whitehead | 156/627 |
| 4,651,203 | 3/1987 | Peterson | 348/95 |
| 4,855,830 | 8/1989 | Davis et al. | 348/86 |
| 4,872,052 | 10/1989 | Liudzius et al. | 348/126 |
| 4,896,206 | 1/1990 | Denham | 348/87 |
| 4,978,220 | 12/1990 | Abramovich et al. | 348/126 |
| 4,988,202 | 1/1991 | Nayar et al. | 348/86 |
| 5,010,578 | 4/1991 | Siener et al. | 348/86 |
| 5,134,665 | 7/1992 | Jyoko | 348/87 |
| 5,140,643 | 8/1992 | Izumi et al. | 348/87 |
| 5,157,463 | 10/1992 | Brown et al. | 348/126 |
| 5,204,912 | 4/1993 | Schimanski | 348/126 |
| 5,237,519 | 8/1993 | Felton | 364/552 |
| 5,311,304 | 5/1994 | Monno | 348/87 |

*Primary Examiner*—Amelia Au
*Assistant Examiner*—Vu Le

[57] ABSTRACT

A video camera is suspended over a printed circuit board for repair by an XY positioning system which permits the camera to be moved into desired positions over the printed circuit board, in alignment with detected defects which have been identified on the printed circuit board, so that an operator is advised of the location of each defect on a conveniently positioned monitor. The image displayed on the monitor can then be used in actually performing the desired repair. The result is an integrated operation which permits the location of detected defects, as well as their repair, without requiring the operator to divert attention from the repair procedures which are then underway. If desired, the image which is present on the monitor can be magnified to facilitate the operator's repairs, and to enhance any inspections required in conjunction with such repairs.

41 Claims, 1 Drawing Sheet

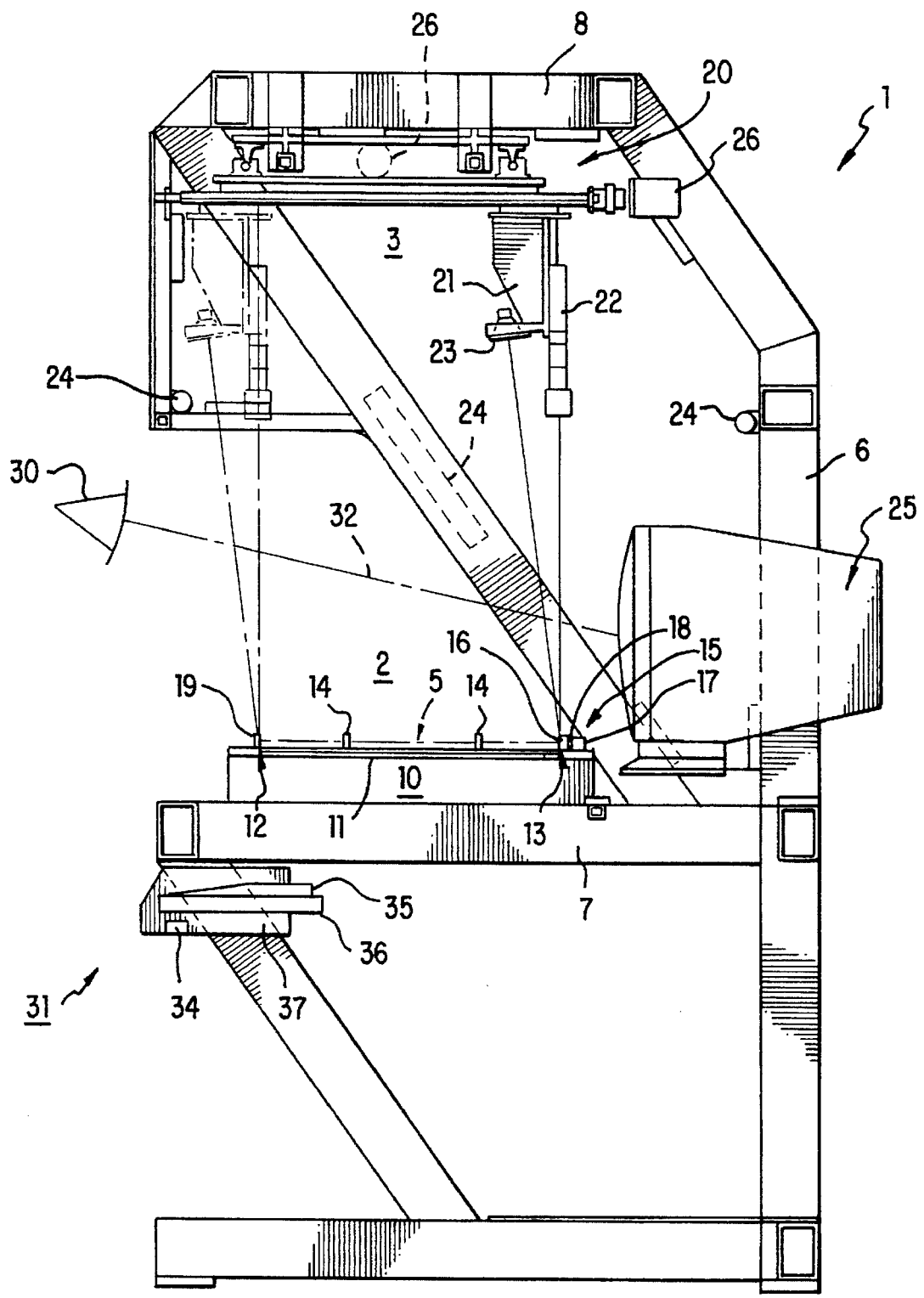

METHOD AND APPARATUS FOR LOCATING AND FACILITATING THE REPAIR OF DEFECTS ON A PRINTED CIRCUIT BOARD

BACKGROUND OF THE INVENTION

1. Field of the Invention

The present invention relates generally to the field of circuit board inspection and repair, and more particularly, to a method and an apparatus for locating defects on a printed circuit board or the like and for facilitating the repair of located defects.

2. Description of Prior Devices

As is well known to persons skilled in the art, a printed circuit board is used for mounting and electrically interconnecting electrical components in a predetermined manner. To the extent possible, such printed circuit boards are constructed mechanically, using automated assembly machines which operate to reduce the often prohibitive costs of manually assembling a printed circuit board. While reducing overall costs, such automated assembly techniques have been found to give rise to a certain limited number of assembly defects such as incorrect insertions of components, and their leads or pins, as well as defects in the soldering procedures which then follow.

Originally, steps were taken to locate assembly errors of this general type through a visual inspection of each printed circuit board at a desired stage of the manufacturing process, by human operators using the naked eye, or possibly a stereo microscope or the like. However, since this procedure was found to be extremely tedious and inaccurate, as well as a relatively expensive process, steps were taken to develop automated systems for inspecting printed circuit boards to replace such visual inspections.

Examples of devices of this general type are the Model 5511, Model 5512, Model 5515, Model 5516 and Model 5517 Printed Circuit Board Inspection Systems which are manufactured by Control Automation Incorporated of Princeton, N.J. These inspection devices generally employ a series of cameras which are mounted within a fixture (an inspection head) adapted for controlled movement relative to a printed circuit board. The inspection head is either sequentially advanced to successive viewing field (typically one inch by one inch) established along the surface of the printed circuit board then under inspection, or continuously advanced along the surface of the printed circuit board, to acquire images for microprocessor analysis to identify potential defects. Further detail regarding the printed circuit board inspection systems which are used to perform these operations are disclosed, for example, in U.S. patent application Ser. No. 07/159,774, filed Feb. 24, 1988 and entitled "Apparatus for Inspecting Printed Circuit Boards with Surface Mounted Components", as well as issued U.S. Pat. Nos. 4,978,220 and 5,060,065, the subject matter of which is incorporated by reference as if fully set forth herein.

Following inspection of the printed circuit boards, steps must be taken to report any detected defects for appropriate correction. Early techniques involved the listing of detected defects, in memory, for subsequent display to the operator. While quite adequate in effectively identifying defects, and in reporting detected defects to the operator, such techniques were found to be somewhat limiting when later applied to the procedures involved in repairing the detected defects identified on an assembled printed circuit board.

Perhaps most significant is that in locating detected defects, and in reporting detected defects to an operator, it remained necessary for separate steps to be taken to actually locate the detected defects on the printed circuit board to be repaired at the repair station provided for such purposes. This is because the operator, upon being advised of the location of a particular defect, still had to then take steps to physically locate the defect on the printed circuit board, for repair in otherwise conventional fashion. Such techniques were found to be somewhat tedious, and at times prone to error. Further complications arose as printed circuit boards came to be manufactured with a greater number of components per unit area (i.e., more "populated"), making such visual operations even more difficult and tedious to accomplish. Recognizing the limitations of such visual operations, steps were taken to automate the procedures necessary to identify defects on a printed circuit board, for correction at a suitable repair station.

One approach to the automated location of detected defects, for repair purposes, was to provide the printed circuit board inspection system with an apparatus for marking the defects found on an inspected printed circuit board, in conjunction with the circuit board inspection procedure. To this end, ink markings were applied to the inspected printed circuit board to later draw the operator's attention to any detected defects during the repair procedure. This, in conjunction with the more traditional listing of defects identified by the printed circuit board inspection system, served to identify necessary repairs for correction.

As a means for accomplishing this, the inspection head of the printed circuit board inspection system was fitted with a separate fixture for receiving an ink marker for applying distinctive markings (dots) to the circuit boards adjacent to the detected defects. Movement of the marker along the printed circuit board was accomplished by moving the inspection head of the printed circuit board inspection system to the location of a detected defect, followed by activation of the marker so as to apply the desired marking to the printed circuit board. Since the marker was directly associated with the inspection head of the printed circuit board inspection system, such marking could be accomplished both directly and automatically making use of control functions already part of the printed circuit board inspection system (for operating the inspection head).

However, in practice, even this technique was found to exhibit certain disadvantages. One such disadvantage is that it was still necessary to in some way compare a listing of the detected defects with the markings on the printed circuit board to make sure that all marked defects had been located by the operator and corrected at the repair station. Once again, this necessitated visual comparisons by the operator at the repair station. Furthermore, it has recently become a practice in conjunction with the manufacture of certain printed circuit boards to eliminate the so-called "post-washing" procedures which had traditionally been employed following manufacture, inspection and repair of the printed circuit boards. This resulted in printed circuit boards which, although repaired, nevertheless still possessed the markings which were applied to them by the marker. Such markings are considered to be undesirable by some manufacturers of printed circuit boards, so much so that the resulting boards are often described as being "contaminated" by the markings which remain on them. The additional steps needed to remove such ink markings represent an additional manufacturing step, which is clearly undesirable.

Responsive to continued demand, steps were then taken to provide the repair station used to correct detected defects with a device which could locate detected defects for repair without requiring itemized listings or ink markings to do so.

This led to the development of the Auto-Locate™ Repair Station which is manufactured by Control Automation Incorporated of Princeton, N.J. To this end, a substantially conventional repair station is provided with a directed light system for indicating detected defects on the printed circuit board by, in essence, pointing to them. The beam of light can be directed either responsive to signals received from the printed circuit board inspection system employed to inspect the printed circuit board, or by transferring data received from the printed circuit board inspection system to an appropriate host computer. In either case, the Auto-Locate™ Repair Station could, for the first time, direct the operator to detected defects on the printed circuit board without requiring the operator to consult separate listings which would then require the operator to divert attention from the printed circuit board to be repaired, and without requiring the marking of printed circuit boards with inks which would later require removal to provide an acceptable finished product.

While the Auto-Locate™ Repair Station was found to constitute a significant advance over prior repair systems, the ever-advancing development of printed circuit boards was found to place yet another constraint on their repair. Specifically, as the "population" of printed circuit boards increased dramatically, the spacings between adjacent features on the printed circuit boards decreased dramatically. This significantly increased the difficulty of locating defects and of making appropriate repairs without the use of enhancements such as a stereo microscope or the like. Resulting from this, it was not uncommon for the operator to have to switch between a first mode in which the operator would locate the detected defect responsive to direction of the beam of light, without using the stereo microscope, and a second mode in which the detected defect would be repaired making use of the stereo microscope. Again, this tended to require the operator to divert attention from the detected defect identified by the beam of light, leading to the disadvantages inherent in other repair procedures.

It therefore became desirable to develop a repair station including a device for identifying detected defects, and for facilitating (e.g., magnifying) their repair, in a more integrated operation which would allow both procedures (location and repair) to be performed substantially simultaneously by the operator.

SUMMARY OF THE INVENTION

It is therefore a principal object of the present invention to provide an improved method and apparatus for positively locating defects identified on a printed circuit board which has been subjected to inspection.

It is also an object of the present invention to provide a method and apparatus for locating detected defects on a printed circuit board, to facilitate the repair of such defects.

It is also an object of the present invention to provide a method and apparatus for locating detected defects on a printed circuit board, in conjunction with a device for repairing the located defects.

It is also an object of the present invention to provide a method and apparatus for locating detected defects on a printed circuit board, which is integrated with a device for repairing the located defects, and which provides an integrated location/repair procedure.

It is also an object of the present invention to provide a method and apparatus for locating detected defects on a printed circuit board, for appropriate repair, which is compatible with existing repair stations and circuit board inspection systems.

It is also an object of the present invention to provide a method and apparatus for locating detected defects on a printed circuit board, in conjunction with the repair of such defects, which facilitates the procedures required of the operator and which permits the operator to perform necessary repairs without having to divert attention from the detected defect during the repair procedure.

These and other objects which will become apparent are achieved in accordance with the present invention by providing a method and an apparatus for locating defects on a printed circuit board which employs a video camera suspended over a printed circuit board for repair by an XY positioning system which permits the camera to be moved into desired positions over the printed circuit board, in alignment with detected defects which have been identified on the printed circuit board. In this fashion, the operator can be advised of the location of each defect, on a conveniently positioned monitor, so that the operator can then (simultaneously) use the image displayed on the monitor to actually perform the desired repair. The result is an integrated operation which permits the location of detected defects, as well as their repair, without requiring the operator to divert attention from the repair procedures which are then underway. If desired, the image which is present on the monitor may be magnified to facilitate the operator's repairs, and to enhance any inspections required in conjunction with such repairs. As a result, both the efficiency and the accuracy of the repair procedure are enhanced by positively identifying all sites requiring attention (avoiding the need to have to refer to separate listings) and without requiring the application of spurious markings to the printed circuit boards (avoiding the need for the removal of such markings following the repair procedure).

For further detail regarding the method and apparatus of this invention, reference is made to a preferred embodiment repair station which is discussed more fully below, taken in conjunction with a single illustration which provides a side elevational view of a repair station which incorporates an apparatus for locating detected defects for correction in accordance with the present invention.

DETAILED DESCRIPTION OF A PREFERRED EMBODIMENT

Generally illustrated in the FIGURE is an apparatus 1 which includes a repair station 2 in association with a defect locating device 3, which combine to provide an integrated system for locating detected defects on a printed circuit board 5 and for facilitating the repair of such defects.

The apparatus 1 is generally comprised of a frame 6 for receiving various components including lower framing elements 7 for receiving the repair station 2 and upper framing elements 8 for receiving the defect locating device 3, for interactive operation as will be discussed more fully below.

The repair station 2 includes a precision board holder 10 having a frame 11 with flanges 12, 13 for receiving two of the edges of a printed circuit board (shown in phantom) positioned for repair, and alignment pins 14 for receiving a third edge of the printed circuit board so that three edges of the printed circuit board are securely received between and against the flanges 12, 13 and the alignment pins 14, for precise alignment within the board holder 10. To accommodate printed circuit boards of different sizes, the flanges 12, 13 are advantageously made adjustable relative to each other. The front flange 12 and the alignment pins 14 are preferably fixed, and are not made adjustable so that two adjacent edges (and one corner) of each printed circuit board are fixed relative to the precision board holder 10 irrespective of the overall size of the printed circuit board being operated upon. The rear flange 13 is preferably made adjustable relative to the front flange 12, and includes a plurality of frictional retainers 15 for engaging edges of the printed circuit board and for retaining the printed circuit board into position within the precision board holder 10. The frictional retainers 15 can take any of a variety of forms, one convenient form including rubber stoppers 16 received within fixtures 17 and including springs 18 for biasing the rubber stoppers 16 outwardly and into frictional engagement with a printed circuit board. The front flange 12 preferably includes a series of fixed pins 19 for engaging edges of the printed circuit board, although additional frictional retainers could be provided along the front flange 12 if desired.

As a consequence of this, once the precision board holder 10 is adjusted to the size of a particular circuit board to be operated upon, by adjusting the spacing between the flanges 12, 13, printed circuit boards under inspection and ready for repair are easily inserted into the precision board holder 10, as received at the repair station 2, automatically ensuring an effective alignment of a printed circuit board prior to its repair. To this end, printed circuit boards can serially and one at a time be inserted into the precision board holder 10 by simply placing the printed circuit board over the flanges 12, 13 of the board holder 10, and against the alignment pins 14, and by pushing the frictional retainers 15 outwardly against the force of the springs 18 (enabling quick insertion and release of the printed circuit boards to be repaired).

The defect locating device 3 generally includes an XY table 20 suspended from the top of the apparatus 1 which includes a fixture 21 for receiving a video camera 22 which is generally normal to the precision board holder 10 of the repair station 2. The fixture 21 additionally, and preferably, includes a light source 23 for illuminating the precision board holder 10 and the printed circuit board which it is to receive. In this fashion, the XY table 20 is able to move the video camera 22 and the light source 23 both longitudinally and transversely above the precision board holder 10, permitting the video camera 22 to view selected areas on a printed circuit board which is retained in position on the precision board holder 10. Ambient light sources 24, such as fluorescent bulbs or the like, are additionally and preferably mounted to the frame 6 so as to surround the precision board holder 10 and the printed circuit boards which it will receive. Such additional lighting is preferred to ensure that all features on the printed circuit boards are adequately illuminated (including curving features such as leads and solder fillets) for effective display as will be discussed more fully below.

The XY table 22 is operated responsive to electrical signals supplied to a pair of drive motors 26 associated with the XY table 20. Electrical signals for operating the drive motors 26 are developed by microprocessor controls which, in operation, are substantially the same as the control signals which are used to regulate movements of the inspection head of a printed circuit board inspection system. To this end, and generally speaking, coordinates representing identified defects located on a printed circuit board are determined and stored in memory, and are applied to the XY table 20 of the apparatus 1 using techniques which in and of themselves are known to persons of ordinary skill in this art field. Such movements may be controlled either directly, responsive to data received from the printed circuit board inspection system, or indirectly, responsive to signals developed by the printed circuit board inspection system, and stored in an appropriate memory device.

The data initially developed by the printed circuit board inspection system is then used to operate the XY table 20, positioning the video camera 22 above detected defects of the printed circuit board which is to be repaired. To be noted is that since such operations are advantageously accomplished through microprocessor controls, circuit boards may be repaired either in the same order in which they are inspected, or in different orders, by accessing the data corresponding to a particular circuit board (e.g., using identification numbers or bar code markings on the circuit boards).

In any event, movements of the XY table 20 serve to align the video camera 22 with defects on the printed circuit board, identifying defects for display on an associated monitor 25 mounted to the frame 6 of the apparatus 1. The actual location of a defect for correction may be signified in any of a number of ways, depending upon the nature of the printed circuit board and operator preferences. For example, the image presented on the monitor 25 may be centered about the detected defect, directing the operator to the location requiring attention while simultaneously allowing the operator to refer to surrounding areas for facilitating the repair procedure. Alternatively, a more positive location of the defect can be presented on the monitor 25 by highlighting affected areas, or affected components or leads, or by using cross-hairs or arrows for marking the affected areas. In all cases, surrounding areas are fully exposed to facilitate location and repair of the detected defect displayed on the monitor 25.

The monitor 25 may be located at any desired position relative to the operator (schematically designated at 30) depending upon convenience and operator preference. However, it is particularly preferred (as illustrated in the FIGURE) to place the monitor 25 to the rear of the apparatus 1, substantially level with, and behind the precision board holder 10 (and the circuit board to be repaired). The reason for this is that the operator 30 is then conveniently and comfortably seated at 31, providing the operator 30 with clear and convenient access to the precision board holder 10 which receives the printed circuit boards to be repaired, as well as a clear, convenient and direct line of sight 32 to the monitor 25.

As a consequence of this, as the video camera 22 of the defect locating device 3 is moved from defect to defect by the XY table 20 (responsive to a foot pedal or other actuating device, or responsive to timed operations regulated by the apparatus 1), the operator 30 is able to easily follow the progress of the repair procedure by viewing the monitor 25. What is more, since the hands of the operator 30 are also substantially within the line of sight 32, the operator 30 is permitted to view the printed circuit board as well as the equipment (not shown) which is used to repair the detected defect (which is held by the hand of the operator) and the defect which is to be repaired (which is then displayed on the monitor 25). Thus, the operator is able to view detected defects, and repair detected defects, in a single integrated operation which avoids the need for the operator to have to divert attention from the procedures which are underway. The operator is then led from defect to defect, positively identifying all of the detected defects on the printed circuit board for repair as necessary (visual inspection at the repair station may reveal that an actual repair is not always needed), without requiring references to separate listings and without placing any markings on the printed circuit boards.

In addition to its integrated operation, the apparatus 1 of the present invention can also provide other enhancements useful in conjunction with the repair of defects located on inspected printed circuit boards. One such enhancement, which is particularly important in connection with the repair of highly populated printed circuit boards, is that the images received by the video camera 22 and displayed on the monitor 25 are well suited to magnification. What is more, such magnification may be controlled and/or varied to suit the particular requirements of an operator, or a particular type of printed circuit board under inspection. It is even possible, if desired, to vary such magnification in accordance with the location on the printed circuit board which is to be viewed, allowing adjustment of the magnification to suit the needs of the operator relative to the components which then populate a given field of view (e.g., increasing magnification for closer tolerances and decreasing magnification for wider tolerances). This can be done either responsive to operator commands, or responsive to a preprogrammed regimen, allowing the operator to proceed with a repair procedure without having to deal with stereo microscopes, or adjustment of the magnification needed to effectively inspect and repair a given component of the printed circuit board. Once again, such operations can be accomplished without requiring the operator to divert attention from the printed circuit board under repair, or the image displayed on the monitor 25, greatly facilitating the efficiency and accuracy of the repair procedure which is taking place.

As previously indicated, the operator 30 is provided with a number of options in inspecting printed circuit boards, and in adjusting movements of the defect locating device 3 and operations of the video camera 22 and the monitor 25 (e.g., magnification). Such functions are advantageously controlled by providing the operator 30 with a mouse 34 and a keyboard 35 which are located for convenient access by the operator (e.g., using a slide mounting 36 associated with a drawer 37) along the front of the apparatus 1, just below the precision board holder 10. In addition to control of the various functions of the apparatus 1, the mouse 34 and/or the keyboard 35 may also advantageously be used to access the printed circuit board inspection system associated with the apparatus 1, or data received from a separately stationed printed circuit board inspection system, as desired. This may be useful in accessing necessary control functions, set-up functions, as well as the data (transactional and statistical) which is capable of being assembled by the apparatus 1 and its associated printed circuit board inspection system. In such case, the monitor 25 can serve a dual function, one in which detected defects are displayed for repair, and another in which necessary machine functions are conveniently displayed for the operator. Again, this is accomplished without requiring the operator to significantly alter their line of sight 32, since all such functions are conveniently controlled from the operator's seated position.

To be noted is that the actual processing of video images for display on the monitor 25, as well as the processing of information received from the printed circuit board inspection system, have not been discussed in significant detail. This is because such functions are in and of themselves based upon techniques which are known to persons of ordinary skill in this art field, and will tend to vary widely for different applications.

It will therefore be understood that various changes in the details, materials and arrangement of parts which have been herein described and illustrated in order to explain the nature of this invention may be made by those skilled in the art within the principal and scope of the invention as expressed in the following claims. Particularly important to note in this regard is that the foregoing apparatus and the corresponding inspection and defect locating methods which are employed are equally applicable to the location of defects on other types of articles (other than printed circuit boards) which are capable of being inspected by automated means.

What is claimed is:

1. A method for locating and for facilitating a repair of defects on an article which has been inspected by automated means for identifying the defects on the article, comprising the steps of:

positioning the article within a holder for aligning the article relative to a known reference;

suspending camera means over the holder, for transverse and longitudinal movements relative to the holder;

moving the camera means to locations over the holder corresponding to the identified defects on the article positioned within the holder, responsive to signals from the defect identifying means; and displaying an image responsive to signals received from the camera means on a monitor positioned adjacent to the holder for the article to define a line of sight from a station for an operator for correcting the located defect to the image displayed on the monitor, wherein the line of sight extends over the holder, wherein the displayed image includes representations of locations on the article corresponding to the identified defects, and wherein the repair of the identified defects occurs while the representations of locations on the article corresponding to the identified defects are displayed on the monitor.

2. The method of claim 1 wherein the article is a circuit board bearing electrical components, and which further comprises the steps of inspecting the circuit board with the defect identifying means, locating detected defects, and storing locations of the detected defects in memory means associated with the defect identifying means.

3. The method of claim 2 which further comprises the step of accessing the memory means to identify the stored locations of the detected defects, for display on the monitor.

4. The method of claim 3 wherein said accessing step includes directly accessing the memory means of the defect identifying means.

5. The method of claim 3 wherein said accessing step is performed by transferring the stored locations from the memory means of the defect identifying means to control means for moving the camera means.

6. The method of claim 1 which further comprises the step of removably positioning articles in the holder following the inspecting of the defect identifying means.

7. The method of claim 6 wherein the inspecting of the articles is performed in an order of inspecting and the positioning of the articles is performed in an order of positioning, and wherein the order of the positioning follows the order of the inspecting.

8. The method of claim 6 wherein the inspecting of the articles is performed in an order of inspecting and the positioning of the articles is performed in an order of positioning, and wherein the order of the positioning differs from the order of the inspecting.

9. The method of claim 8 which further comprises the step of marking the articles with an identification, for determining the order of inspecting and the order of positioning.

10. The method of claim 1 which further comprises the step of illuminating the article while positioned within the holder.

11. The method of claim 10 wherein the illuminating step is performed by means associated with the camera means, for movement over the holder in accordance with movements of the camera means.

12. The method of claim 10 wherein the illuminating step is performed by ambient lighting surrounding the holder for the article and independent of movements of the camera means.

13. The method of claim 1 wherein the image is displayed at a location generally behind the holder for the article, on a side of the holder opposing the operator station.

14. The method of claim 13 wherein the monitor, the holder and the operator station are aligned along the line of sight.

15. The method of claim 1 which further includes the step of repairing a located defect displayed on the monitor.

16. The method of claim 15 which further comprises the step of repairing all located defects responsive to controlled movements of the camera means.

17. The method of claim 1 which further comprises the step of magnifying the image displayed on the monitor.

18. The method of claim 1 which further comprises the step of indicating the location of a detected defect on the image displayed on the monitor.

19. The method of claim 1 which further comprises the step of controlling the locating of defects, the moving of the camera means and the displaying of images on the monitor, with host computer means positioned adjacent to the holder for the article and an operator for viewing the displayed images.

20. The method of claim 1 which further includes the steps of identifying the defects on the article, using the defect identifying means, and identifying the locations corresponding to the identified defects on the article.

21. The method of claim 20 which further includes the step of communicating the locations of the identified defects to means for moving the camera means to the locations corresponding to the identified defects.

22. The method of claim 21 which further includes the steps of displaying the locations corresponding to the identified defects on the article, and viewing the displayed locations to facilitate repair on the identified defects.

23. An apparatus for locating and for facilitating a repair of defects on an article which has been inspected by automated means for identifying the defects on the article, comprising:

a holder for receiving the article and for positioning the article relative to a known reference;

camera means for obtaining images from the article received within the holder;

means for suspending the camera means over the holder, for obtaining the images from the article received within the holder, including means for moving the suspended camera means to locations over the holder corresponding to the defects identified on the article positioned within the holder; and monitor means coupled with the camera means, for displaying images obtained from the article, wherein the monitor means is positioned adjacent to the holder for the article to define a line of sight from a station for an operator for correcting the located defects to the images displayed on the monitor means, wherein the line of sight extends over the holder, wherein the displayed images include representations of locations on the article corresponding to the identified defects, and wherein the repair of the identified defects occurs while the representations of locations on the article corresponding to the identified defects are displayed on the monitor means.

24. The apparatus of claim 23 wherein the article is a circuit board.

25. The apparatus of claim 24 wherein the holder includes means for releasably retaining the circuit board within the holder.

26. The apparatus of claim 25 wherein the retaining means include frictional members biased for engagement with the circuit board to be received within the holder.

27. The apparatus of claim 24 wherein the holder includes adjustment means for receiving circuit boards of different sizes.

28. The apparatus of claim 23 wherein the camera means is a video camera, and wherein the means for displaying the images is a monitor responsive to signals received from the video camera.

29. The apparatus of claim 23 wherein the means for suspending the camera means and for moving the suspended camera means is an XY table positioned for longitudinal and transverse movement relative to the holder for the article.

30. The apparatus of claim 29 which further includes means for illuminating the article within the holder, fixed to portions of the XY table for receiving the camera means, for movement with the camera means relative to the holder.

31. The apparatus of claim 23 which further includes ambient lighting for illuminating the article within the holder, fixed to the apparatus and stationary relative to movements of the camera means.

32. The apparatus of claim 23 which further includes means for receiving data from the automated means for identifying the defects on the article, and means associated with the data receiving means for controlling operations of the means for moving the suspended camera means to the locations over the holder.

33. The apparatus of claim 32 wherein the apparatus for locating the defects is in direct communication with the defect identifying means.

34. The apparatus of claim 32 wherein the defect identifying means includes memory means for storing the locations of the defects identified on the article, and wherein the operation controlling means includes microprocessor means for receiving and operating upon the memory means received from the defect identifying means.

35. The apparatus of claim 23 which further includes means for magnifying images displayed on the means for displaying images.

36. The apparatus of claim 23 which further includes means for indicating the location of a detected defect on an image displayed on the means for displaying the images.

37. The apparatus of claim 23 which further comprises the defect identifying means, for identifying the defects on the article and for identifying the locations corresponding to the defects identified on the article.

38. The apparatus of claim 37 wherein the defect identifying means communicates with the apparatus for locating the defects on the article, and the moving means.

39. The apparatus of claim 38 which further comprises means for displaying the locations corresponding to the defects identified on the article, so the defects on the article are capable of being viewed to facilitate repair of the defects identified.

40. The apparatus of claim 23 wherein the monitor means is located generally being the holder for the article, on a side of the holder opposing the operator station.

41. The apparatus of claim 40 wherein the monitor means, the holder and the operator station are aligned along the line of sight.

* * * * *